United States Patent
Huber

(10) Patent No.: US 10,684,553 B2
(45) Date of Patent: Jun. 16, 2020

(54) WAVEFRONT CORRECTION ELEMENT FOR USE IN AN OPTICAL SYSTEM

(71) Applicant: Carl Zeiss SMT GmbH, Oberkochen (DE)

(72) Inventor: Peter Huber, Heidenheim (DE)

(73) Assignee: CARL ZEISS SMT GMBH, Oberkochen (DE)

(*) Notice: Subject to any disclaimer, the term of this patent is extended or adjusted under 35 U.S.C. 154(b) by 0 days.

(21) Appl. No.: 16/595,800

(22) Filed: Oct. 8, 2019

(65) Prior Publication Data

US 2020/0033735 A1    Jan. 30, 2020

Related U.S. Application Data

(63) Continuation of application No. PCT/EP2018/056353, filed on Mar. 14, 2018.

(30) Foreign Application Priority Data

Apr. 11, 2017 (DE) .................. 10 2017 206 256

(51) Int. Cl.
G03F 7/20 (2006.01)
G02B 26/06 (2006.01)

(52) U.S. Cl.
CPC ......... *G03F 7/70308* (2013.01); *G02B 26/06* (2013.01); *G03F 7/702* (2013.01);
(Continued)

(58) Field of Classification Search
None
See application file for complete search history.

(56) References Cited

U.S. PATENT DOCUMENTS

| 3,904,274 A | 9/1975 | Feinleib et al. |
| 4,257,686 A | 3/1981 | Albertinetti et al. |

(Continued)

FOREIGN PATENT DOCUMENTS

| DE | 102006045075 A1 | 4/2008 |
| DE | 102013102670 A1 | 10/2014 |

(Continued)

OTHER PUBLICATIONS

GPTO Office Action with English translation, German Application No. 10 2017 206 256.8, dated Nov. 8, 2017, 7 pages.
(Continued)

*Primary Examiner* — Michelle M Iacoletti
(74) *Attorney, Agent, or Firm* — Edell, Shapiro & Finnan, LLC

(57) ABSTRACT

A wavefront correction element for use in an optical system, in particular in an optical system of a microlithographic projection exposure apparatus, includes a substrate (220, 230), an arrangement of electrically conductive conductor tracks (222, 232) provided on the substrate, wherein a wavefront of electromagnetic radiation incident on the wavefront correction element is manipulatable by electrical driving of the conductor tracks, and an insulating layer (221, 231), which electrically insulates the conductor tracks from one another, wherein the insulating layer has first regions and second regions, wherein the electrical breakdown strength of the insulating layer to withstand a breakdown of electrical charge through the insulating layer as far as the arrangement of conductor tracks is lower in the second regions than in the first regions by at least a factor of two.

20 Claims, 4 Drawing Sheets

(52) U.S. Cl.
CPC ........ *G03F 7/7015* (2013.01); *G03F 7/70191* (2013.01); *G03F 7/70266* (2013.01); *G03F 7/70316* (2013.01); *G03F 7/70241* (2013.01)

(56) References Cited

U.S. PATENT DOCUMENTS

| | | |
|---|---|---|
| 8,486,843 B2 | 7/2013 | Li et al. |
| 8,508,854 B2 | 8/2013 | Eva et al. |
| 8,891,172 B2 | 11/2014 | Eva et al. |
| 10,061,205 B2 | 8/2018 | Ehm et al. |
| 2009/0257032 A1 | 10/2009 | Eva et al. |
| 2016/0187543 A1 | 6/2016 | Bekman et al. |

FOREIGN PATENT DOCUMENTS

| | | |
|---|---|---|
| DE | 102013221522 A1 | 4/2015 |
| DE | 102014206765 A1 | 10/2015 |
| DE | 102014216240 A1 | 2/2016 |
| DE | 102015226014 A1 | 3/2016 |
| EP | 0678768 A2 | 10/1995 |
| EP | 1921505 A1 | 5/2008 |
| WO | 2013109986 A1 | 7/2013 |
| WO | 2014117791 A1 | 8/2014 |
| WO | 2015155061 A1 | 10/2015 |

OTHER PUBLICATIONS

PCT International Preliminary Report on Patentability, PCT/EP2018/056353, dated Oct. 15, 2019, 16 pages.
International Search Report and the Written Opinion, PCT/EP2018/056353, dated Jun. 21, 2018, 14 pages.

WAVEFRONT CORRECTION ELEMENT FOR USE IN AN OPTICAL SYSTEM

CROSS REFERENCE TO RELATED APPLICATIONS

This is a Continuation of International Application PCT/EP2018/056353, which has an international filing date of Mar. 14, 2018, and the disclosure of which is incorporated in its entirety into the present Continuation by reference. This Continuation also claims foreign priority under 35 U.S.C. § 119(a)-(d) to and also incorporates by reference, in its entirety, German Patent Application DE 10 2017 206 256.8 filed on Apr. 11, 2017.

FIELD OF THE INVENTION

The invention relates to a wavefront correction element for use in an optical system, in particular in an optical system of a microlithographic projection exposure apparatus.

BACKGROUND

Microlithography is used for producing microstructured components such as, for example, integrated circuits or LCDs. The microlithography process is carried out in what is called a projection exposure apparatus, which comprises an illumination device and a projection lens. The image of a mask (=reticle) illuminated by the illumination device is in this case projected by the projection lens onto a substrate (for example a silicon wafer) coated with a light-sensitive layer (photoresist) and arranged in the image plane of the projection lens, in order to transfer the mask structure to the light-sensitive coating of the substrate.

In a projection exposure apparatus designed for the EUV range, i.e. at wavelengths of e.g. approximately 13 nm or approximately 7 nm, owing to the lack of availability of suitable lighttransmissive refractive materials, reflective optical elements are used as optical components for the imaging process.

In this case, it is known, inter alia, to use wavefront correction elements in order to correct a wavefront aberration that occurs during operation of the optical system.

One possible approach for this purpose is the configuration of a wavefront correction element with electrically conductive conductor tracks arranged in a distributed manner at at least one surface, the interaction of the wavefront correction element with incident electromagnetic radiation being able to be influenced by way of the electrical driving of said conductor tracks. The resultant achievable manipulation of the wavefront of the electromagnetic radiation, depending on (transmissive or reflective) configuration, may be based in particular on a change in refractive index and/or deformation of the wavefront correction element brought about by the electrical driving of the conductor tracks.

One problem that occurs here in practice, however, is that during the production process of the wavefront correction element and/or during operation thereof, a surface of the wavefront correction element may become electrically charged vis-à-vis the conductor tracks buried in an insulating layer. As the electric field strength increases, an electrical breakdown through the relevant insulating layer can ultimately take place. The attendant flashlike electrical discharge can result in partial melting of the insulating layer and also of the conductor tracks through to damage or even destruction of the conductor tracks and possibly electrical components connected thereto.

The scenario described above is illustrated merely schematically and in a greatly simplified manner in FIGS. 3A and 3B.

FIG. 3A firstly shows the accumulation of negative electrical charge on an insulating layer 331, which electrically insulates the conductor tracks 332 provided on a substrate 330 from one another. Whereas in the situation illustrated in FIG. 3A said electrical charge does not yet flow away on account of the presence of the insulating layer 331, FIG. 3B illustrates a situation in which further charge accumulation has taken place. As the electric field strength rises, an electrical breakdown and an attendant flashlike electrical discharge via a breakdown channel designated by "350" ultimately occur, which results in partial melting of the insulating layer 331 and also of the conductor tracks 332.

With regard to the prior art, reference is made merely by way of example to U.S. Pat. No. 8,508,854 B2 and U.S. Pat. No. 8,891,172 B2.

SUMMARY

It is an object of the present invention to provide a wavefront correction element for use in an optical system, in particular in an optical system of a microlithographic projection exposure apparatus, which has improved protection vis à vis damage or destruction as a result of the electrical discharge processes described in the introduction.

This object is achieved with a reflective optical element in accordance with the features of the independent patent claims.

A wavefront correction element according to the invention for use in an optical system, in particular in an optical system of a microlithographic projection exposure apparatus, comprises:

a substrate, an arrangement of electrically conductive conductor tracks provided on the substrate, wherein a wavefront of electromagnetic radiation incident on the wavefront correction element is manipulatable by electrical driving of the conductor tracks, and an insulating layer, which electrically insulates the conductor tracks from one another, wherein the insulating layer has first regions and second regions, wherein the electrical breakdown strength of the insulating layer to withstand a breakdown of electrical charge through the insulating layer as far as the arrangement of conductor tracks is lower in the second regions than in the first regions by at least a factor of two.

The invention firstly proceeds from the consideration that ultimately what is crucial for the extent of the damage or destruction of, inter alia, the electrical conductor tracks as a result of the electrical breakdown described above is the energy released during said breakdown, which is in turn quadratically dependent on the electrical voltage established at the wavefront correction element.

Proceeding from this consideration, the invention is based on the concept, in particular, of ensuring, by suitable configuration of the insulating layer, which electrically insulates the conductor tracks from one another, that said electrical breakdown already takes place at lower electrical voltage with the consequence that the amount of energy released in the process is also significantly reduced and, accordingly, destruction of the conductor tracks can be prevented.

According to the invention, then, this breakdown that commences "earlier"—i.e. at even lower electrical voltage established—is achieved by way of a targeted weakening of the insulating layer insofar as the insulating layer has regions having significantly reduced electrical breakdown strength. The invention thus includes, in particular, a departure from conventional concepts striving for a configuration of the layer construction in as dense and compact a manner as possible. By virtue of the fact that the insulating layer has first regions having a comparatively high electrical breakdown strength and second regions having a comparatively significantly lower electrical breakdown strength, what is achieved is that optically comparatively high-quality layer regions (having e.g. a small stray light and absorption effect in the case of a transmissive configuration of the wavefront correction element) are combined with regions which, although they bring about a local impairment of the optical properties, in return enable the above-described electrical breakdown at even lower electrical voltage.

In accordance with one embodiment, the second regions can have a reduced density in comparison with the first regions.

In accordance with one embodiment, the insulating layer has in the second regions channel-shaped defects extending as far as the arrangement of conductor tracks. What is achieved thereby is that the electrical insulation effect of the insulating layer is lower in the region of the electrically conductive conductor tracks, with the result that the electrical breakdown takes place at lower electrical voltage as desired. In order to produce said channel-shaped defects, as explained in even greater detail below, it is possible to use a suitable low-energy coating process in the course of applying the insulating layer, wherein the layer-forming particles have a comparatively low energy (of an order of magnitude of 1 eV, for example).

The invention further also relates to a wavefront correction element for use in an optical system, in particular in an optical system of a microlithographic projection exposure apparatus, comprising:

a substrate, an arrangement of electrically conductive conductor tracks provided on the substrate, wherein a wavefront of electromagnetic radiation incident on the wavefront correction element is manipulatable by electrical driving of the conductor tracks, and an insulating layer, which electrically insulates the conductor tracks from one another, wherein the insulating layer has channel-shaped defects extending as far as the arrangement of conductor tracks.

In accordance with a further embodiment, the insulating layer can comprise particles that disturb the layer growth of the insulating layer. Preferably, the material of the particles that disturb the layer growth is a material which either corresponds to that of the insulating layer or has the least possible difference in refractive index with respect thereto (of e.g. a maximum of 10% relative to the larger refractive index). As a result, in the case of a transmissive configuration of the wavefront correction element, it is possible to minimize a light loss on account of the relevant particles. In embodiments, e.g. the insulating layer can be produced from quartz glass ($SiO_2$), whereas the relevant particles can likewise comprise quartz glass ($SiO_2$) or calcium fluoride ($CaF_2$).

In accordance with one embodiment, the wavefront correction element is a transmissive optical element. In this case, the wavefront correction element can be configured in particular as a plane-parallel plate having a thickness of a few mm, which is locally heated by the electrical driving of the conductor tracks and, by way of the attendant change in refractive index, influences the phase or wavefront of the electromagnetic radiation passing through the wavefront correction element, but has no optical effect when electric current is switched off.

However, the invention is not restricted to the configuration described above. In further configurations, the wavefront correction element can also be configured as a reflective optical element (e.g. having concave geometry).

In accordance with an embodiment, the wavefront correction element is designed for an operating wavelength of less than 30 nm, in particular less than 15 nm.

Further, the invention also relates to a method for producing a wavefront correction element for use in an optical system, in particular in an optical system of a microlithographic projection exposure apparatus, wherein the method comprises the following steps:

providing a substrate, applying an arrangement of electrically conductive conductor tracks on the substrate, and applying an insulating layer, which electrically insulates the conductor tracks from one another, wherein applying the insulating layer is carried out in such a way that the insulating layer has first regions and second regions, wherein the electrical breakdown strength of the insulating layer to withstand a breakdown of electrical charge through the insulating layer as far as the arrangement of conductor tracks is lower in the second regions than in the first regions by at least a factor of two.

In accordance with one embodiment, applying the insulating layer is carried out in a coating process in which the layer-forming particles have an energy of a maximum of 5 eV, in particular a maximum of 1 eV.

In accordance with one embodiment, the coating process is a plasma enhanced chemical vapor deposition (PECVD) process or a physical vapor deposition (PVD) process.

In accordance with one embodiment, before or during the process of applying the insulating layer, particles that disturb the layer growth of the insulating layer are applied.

In accordance with one embodiment, the insulating layer comprises a first material and the particles comprise a second material, wherein the refractive indices of the first and second materials at the operating wavelength of the optical system differ from one another by a maximum of 10%.

In respect of further preferred configurations and advantages of the method, reference is made to the above explanations in association with the wavefront correction element according to the invention.

The invention further relates to an optical system of a microlithographic projection exposure apparatus, in particular an illumination device or a projection lens, and also to a microlithographic projection exposure apparatus comprising at least one wavefront correction element having the features described above.

Further configurations of the invention can be gathered from the description and the dependent claims.

The invention is explained in greater detail below on the basis of exemplary embodiments that are illustrated in the accompanying Figures.

BRIEF DESCRIPTION OF THE DRAWINGS

FIGS. 2A-2C show schematic illustrations for explaining various embodiments of the invention, in which FIG. 2A shows a basic construction of a wavefront correction element, FIG. 2B shows an element with channel defects, and FIG. 2C shows an element with channel defects and layer-growth disturbing particles; and FIGS. 3A and 3B show schematic illustrations for explaining a problem addressed by the invention, in which FIGS. 3A and 3B show wavefront correction elements exhibiting, respectively, accumulating electrical charge and electrical breakdown.

DETAILED DESCRIPTION

Figure 1:
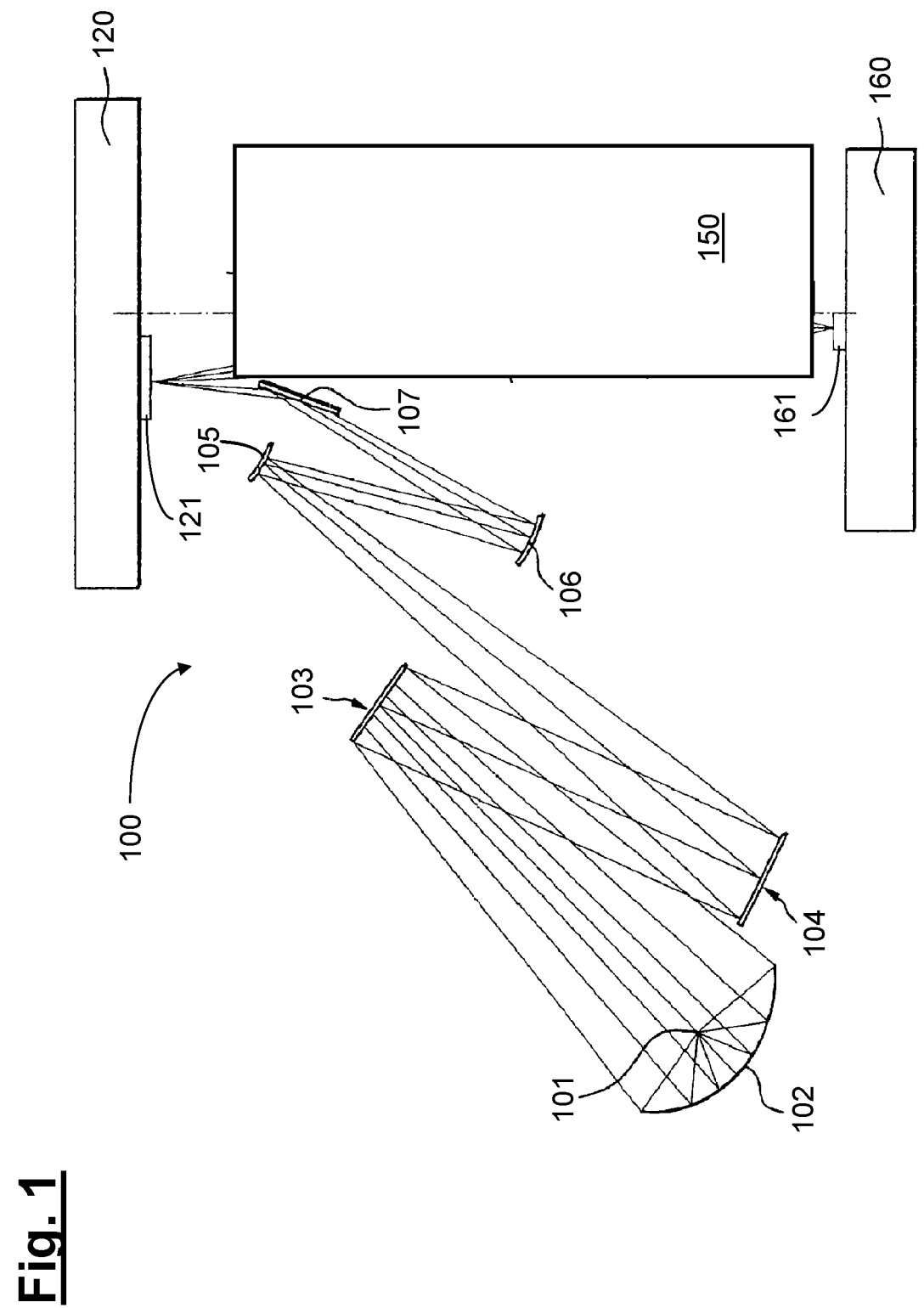
FIG. 1 shows a schematic illustration of the possible construction of a microlithographic projection exposure apparatus designed for operation in the EUV.

FIG. 1 shows a schematic illustration of an exemplary projection exposure apparatus 100 which is designed for operation in the EUV and in which the present invention can be realized.

According to FIG. 1, an illumination device of the projection exposure apparatus 100 comprises a field facet mirror 103 and a pupil facet mirror 104. The light from a light source unit comprising a plasma light source 101 and a collector mirror 102 is directed onto the field facet mirror 103. A first telescope mirror 105 and a second telescope mirror 106 are arranged in the light path downstream of the pupil facet mirror 104. A deflection mirror 107 operated with grazing incidence is arranged downstream in the light path and directs the radiation impinging on it onto an object field in the object plane of a projection lens, which is merely indicated in FIG. 1. At the location of the object field, a reflective structure-bearing mask 121 is arranged on a mask stage 120, said mask being imaged with the aid of a projection lens 150 into an image plane in which a substrate 161 coated with a light-sensitive layer (photoresist) is situated on a wafer stage 160.

Figure 2A:
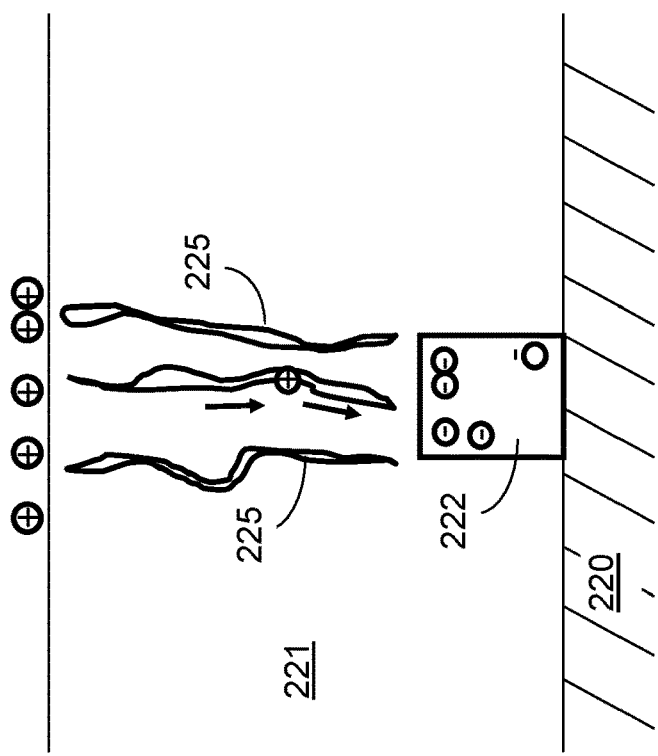

During operation of the projection exposure apparatus 100, at any suitable location it is then possible to use a wavefront correction element according to the invention for correcting wavefront aberrations that occur, wherein possible configurations of this wavefront correction element are described below with reference to the schematic illustrations in FIGS. 2A-2C.

Figure 3A:
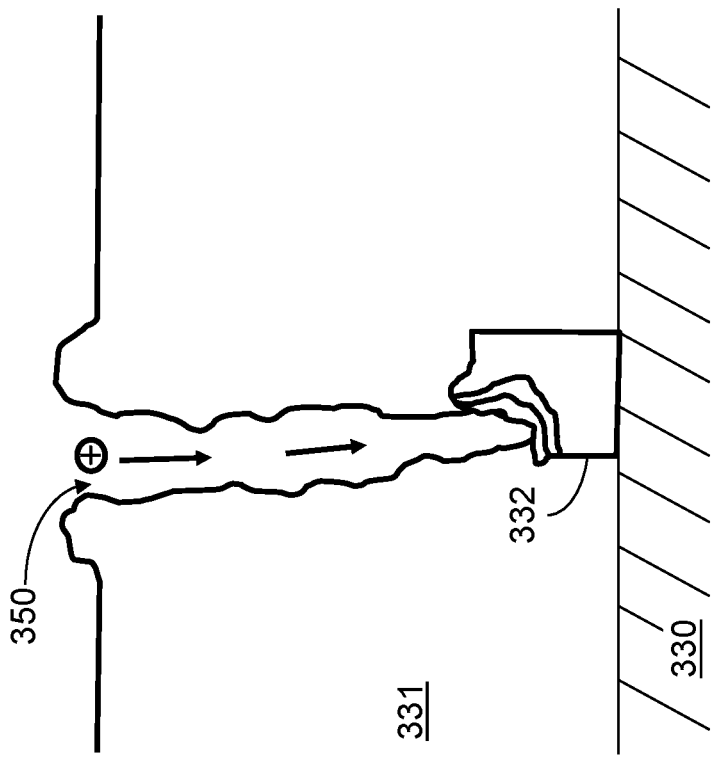
Figure 3B:
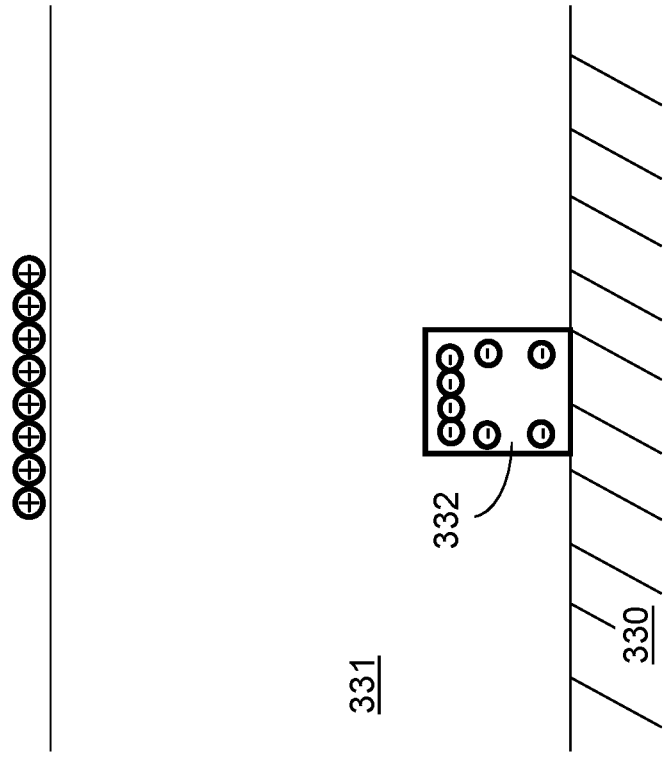

FIG. 2A firstly shows once again the basic construction of a wavefront correction element comprising conductor tracks 212 situated on a substrate 210 and electrically insulated from one another by an insulating layer 211, wherein the insulating layer 211 can be produced e.g. from quartz glass ($SiO_2$) and the conductor tracks 212 can be produced e.g. from chromium (Cr). The wavefront of electromagnetic radiation incident on the wavefront correction element is manipulatable in a desired manner by the electrical driving of the conductor tracks 212, but in the absence of further measures, with increasing accumulation of electrical charges on the insulating layer 211 and thus as the electric field strength increases, the electrical breakdown already described in the introduction with reference to FIG. 3B—and thus damage to the conductor tracks 212 and possibly to the electronic components connected thereto—can ultimately occur.

According to the invention, then, the risk of destruction of the conductor tracks as a result of said electrical breakdown is reduced by virtue of the fact that, as a result of suitable configuration of the insulating layer, said electrical breakdown is not prevented per se, but is brought about already at a lower electric field strength or electrical voltage. Since the energy released during the electrical breakdown increases quadratically with the electrical voltage established, less energy is released during such a breakdown which takes place already at a significantly lower electrical voltage. This has the result that corresponding damage to insulating layer and/or conductor track is significantly reduced and possibly rendered negligible. Merely by way of example, the electrical voltage at which the electrical breakdown takes place can be reduced from a value of the order of magnitude of 1000 volts to e.g. of the order of magnitude of 100 volts on account of the configuration according to the invention.

In order, then, to achieve the above-described reduction of the electrical breakdown strength of the insulating layer, according to the invention the insulating layer is embodied regionally with channel-shaped defects extending as far as the arrangement of conductor tracks. In FIG. 2B and FIG. 2C, such channel-shaped defects are designated by "225" and "235", respectively, wherein moreover components which are analogous or substantially functionally identical to those in FIG. 2A are designated by reference signs increased by "10" and "20", respectively. The porosity of the insulating layer 221 and 231, respectively, that is provided by said channel-shaped defects 225, 235 can be achieved in various ways, as explained below.

Figure 2B:
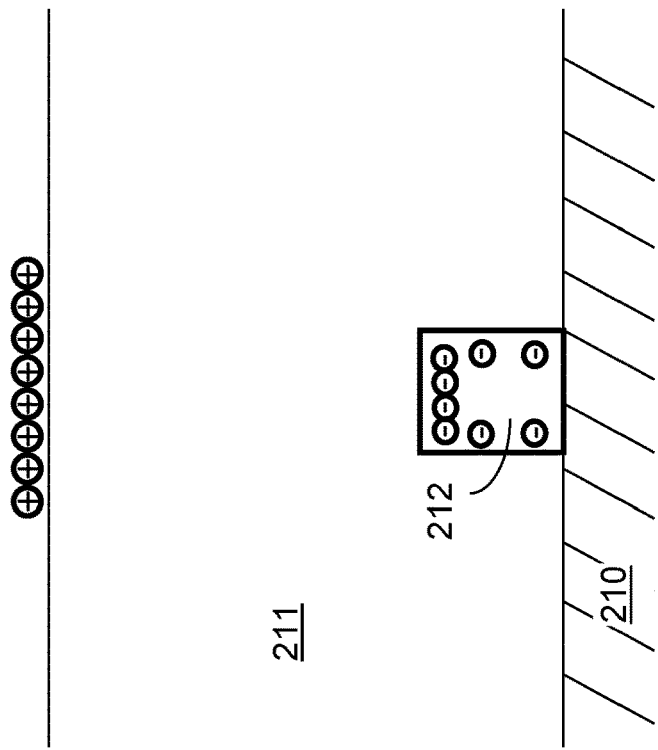

In embodiments of the invention, the presence of the conductor tracks 222 in accordance with FIG. 2B can itself be used to produce said channel-shaped defects 225 during the process of producing the insulating layer 221, with use being made of the geometric shading effect brought about by the conductor tracks 222 and the attendant disturbance of the layer growth. For a geometric shading effect of the conductor tracks 222 that is as pronounced as possible, a coating process in which the layer-forming particles have an energy of a maximum of 5 eV, in particular a maximum of 1 eV, is preferably used for applying the insulating layer 221. Suitable low-energy coating processes are e.g. PECVD or PVD processes. In this case, moreover, the disturbance of the layer growth can be influenced by way of the geometric shape of the conductor tracks 222. Merely by way of example, said conductor tracks 222 can have dimensions of 100 nm*100 nm in cross section, wherein a comparatively higher and narrower configuration of the conductor tracks 222 can lead to a more pronounced shading effect and thus more highly pronounced channel-shaped defects 225.

Said channel-shaped defects 225 form (in a manner that is advantageous for an electrical breakdown occurring at even low electrical voltage) above the conductor tracks 222.

Besides the regions of reduced electrical breakdown strength provided by the channel-shaped defects 225 (which regions enable the above-described electrical breakdown at even lower electrical voltage, but in return also bring about a local impairment of the optical properties), the insulating layer 221 and 231, respectively, still has in the remaining regions a comparatively dense and substantially undisturbed, compact layer construction having a comparatively high electrical breakdown strength (with e.g. a small stray light and absorption effect in the case of a transmissive configuration of the wavefront correction element).

Figure 2C:
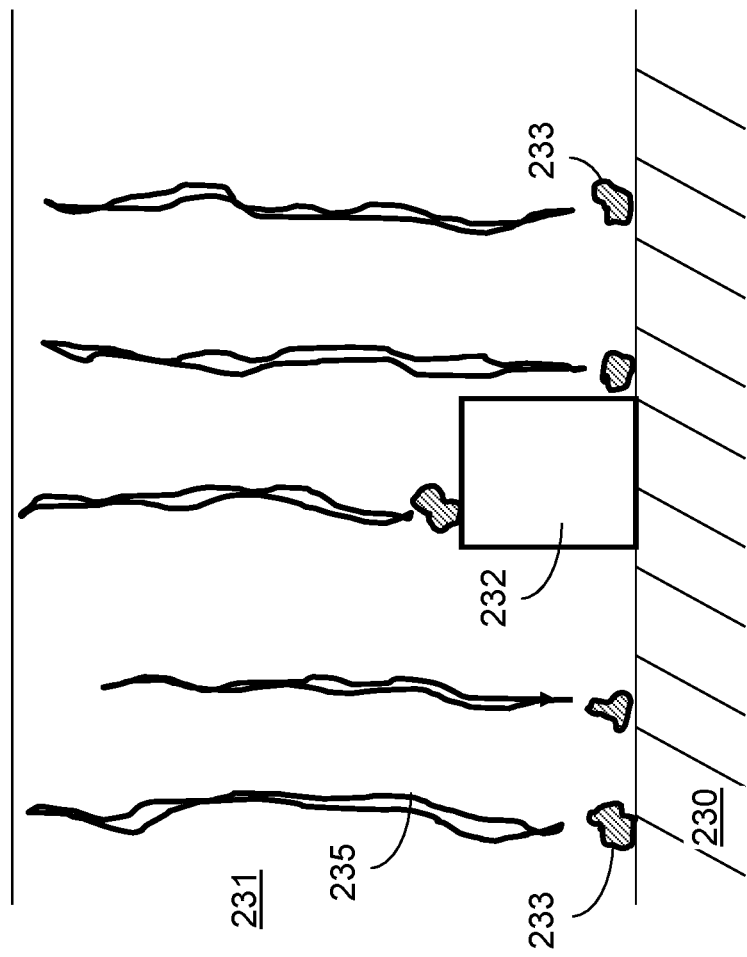

In further embodiments, additionally or alternately, as indicated in FIG. 2C, particles 233 can also be applied during the coating process in order to disturb the layer growth. In the case of a transmissive configuration of the wavefront correction element, a material (e.g. quartz glass ($SiO_2$) or calcium fluoride ($CaF_2$)) having a refractive index which corresponds to that of the insulating layer 231 or deviates only slightly therefrom is preferably chosen for the particles 233.

Even though the invention has been described on the basis of specific embodiments, numerous variations and alternative embodiments will be apparent to a person skilled in the art, for example by combination and/or exchange of features of individual embodiments. Accordingly, such variations and alternative embodiments are concomitantly encompassed by the present invention, and the scope of the invention is restricted only within the meaning of the accompanying patent claims and equivalents thereof

What is claimed is:

1. A wavefront correction element for use in an optical system, comprising:
   a substrate;
   an arrangement of electrically conductive conductor tracks provided on the substrate and configured to be electrically driven to manipulate a wavefront of electromagnetic radiation incident on the wavefront correction element; and
   an insulating layer, which electrically insulates the conductor tracks from one another;
   wherein the insulating layer has first regions and second regions, wherein an electrical breakdown strength of the insulating layer to withstand a breakdown of electrical charge through the insulating layer as far as the arrangement of conductor tracks is lower in the second regions than in the first regions by at least a factor of two.

2. The wavefront correction element as claimed in claim 1, wherein the second regions have a reduced density in comparison with a density of the first regions.

3. The wavefront correction element as claimed in claim 1, wherein the insulating layer has channel-shaped defects extending as far as the arrangement of conductor tracks in the second regions.

4. The wavefront correction element as claimed in claim 1, wherein the insulating layer comprises quartz glass ($SiO_2$).

5. The wavefront correction element as claimed in claim 1 and configured as a transmissive optical element.

6. The wavefront correction element as claimed in claim 1 and configured as a reflective optical element.

7. The wavefront correction element as claimed in claim 1 and configured for an operating wavelength of less than 30 nm.

8. An optical system of a microlithographic projection exposure apparatus, comprising at least one wavefront correction element which is embodied as claimed in claim 1.

9. A microlithographic projection exposure apparatus comprising an illumination device and a projection lens, wherein at least one of the illuminating device and the projection lens comprises a wavefront correction element as claimed in claim 1.

10. A wavefront correction element for use in an optical system, comprising:
    a substrate;
    an arrangement of electrically conductive conductor tracks provided on the substrate and configured to be electrically driven to manipulate a wavefront of electromagnetic radiation incident on the wavefront correction element; and
    an insulating layer, which electrically insulates the conductor tracks from one another;
    wherein the insulating layer has channel-shaped defects extending as far as the arrangement of conductor tracks.

11. The wavefront correction element as claimed in claim 1, wherein the insulating layer comprises particles that disturb layer growth of the insulating layer.

12. The wavefront correction element as claimed in claim 11 and configured to operate at an operating wavelength, wherein the insulating layer comprises a first material and the particles comprise a second material, wherein refractive indices of the first material and of the second material differ from one another by a maximum of 10% at the operating wavelength.

13. The wavefront correction element as claimed in claim 12, wherein the second material is selected from the group consisting essentially of quartz glass ($SiO_2$) and calcium fluoride ($CaF_2$).

14. A method for producing a wavefront correction element, comprising:
    a) providing a substrate;
    b) applying an arrangement of electrically conductive conductor tracks on the substrate; and
    c) applying an insulating layer, which electrically insulates the conductor tracks from one another;
    wherein applying the insulating layer comprises providing the insulating layer with first regions and with second regions, and
    wherein an electrical breakdown strength of the insulating layer to withstand a breakdown of electrical charge through the insulating layer as far as the arrangement of conductor tracks is lower in the second regions than in the first regions by at least a factor of two.

15. The method as claimed in claim 14, wherein applying the insulating layer is carried out in a coating process in which the layer-forming particles have an energy of no more than 5 eV.

16. The method as claimed in claim 15, wherein the coating process is a plasma enhanced chemical vapor deposition process or a physical vapor deposition process.

17. The method as claimed in claim 14, further comprising applying particles that disturb a layer growth of the insulating layer before or during the process of applying the insulating layer.

18. The method as claimed in claim 17, further comprising providing the wavefront correction element in an optical system, wherein the insulating layer comprises a first material and the particles comprise a second material, wherein refractive indices of the first material and of the second material differ from one another by a maximum of 10% at an operating wavelength of the optical system.

19. An optical system of a microlithographic projection exposure apparatus, comprising at least one wavefront correction element which is produced by the method as claimed in claim 14.

20. A microlithographic projection exposure apparatus comprising an illumination device and a projection lens, wherein at least one of the illuminating device and the projection lens comprises a wavefront correction element which is produced by the method as claimed in claim 14.

* * * * *

UNITED STATES PATENT AND TRADEMARK OFFICE
CERTIFICATE OF CORRECTION

PATENT NO.       : 10,684,553 B2
APPLICATION NO.  : 16/595800
DATED            : June 16, 2020
INVENTOR(S)      : Peter Huber Page 1 of 1

It is certified that error appears in the above-identified patent and that said Letters Patent is hereby corrected as shown below:

In the Specification

Column 1, Line 38, Delete "lighttransmissive" and insert -- light transmissive --, therefor.

Column 7, Line 5, After "thereof" insert -- . --.

Signed and Sealed this
Twenty-ninth Day of December, 2020

Andrei Iancu
*Director of the United States Patent and Trademark Office*